United States Patent [19]

Ikuta et al.

[11] Patent Number: 5,789,797
[45] Date of Patent: Aug. 4, 1998

[54] SEMICONDUCTOR DEVICE THAT SUPPRESSES ELECTROMAGNETIC NOISE

[75] Inventors: Toshio Ikuta, Handa; Noboru Endou, Nukata; Masahiro Aratani, Okazaki, all of Japan

[73] Assignee: Nippondenso Co., Ltd., Kariya, Japan

[21] Appl. No.: 687,681

[22] Filed: Jul. 26, 1996

[30] Foreign Application Priority Data

Jul. 28, 1995 [JP] Japan .................................. 7-193506
Jul. 28, 1995 [JP] Japan .................................. 7-193507

[51] Int. Cl.$^6$ .................... H01L 29/00; H01L 29/82; H01L 23/48
[52] U.S. Cl. .................... 257/533; 257/421; 257/776; 438/3; 438/128; 438/597
[58] Field of Search .................... 257/533, 421, 257/428, 776; 438/3, 128–132, 597–599

[56] References Cited

U.S. PATENT DOCUMENTS

| | | |
|---|---|---|
| 4,992,744 | 2/1991 | Fujita et al. .................... 328/233 |
| 5,610,414 | 3/1997 | Yoneda et al. .................... 257/99 |
| 5,625,218 | 4/1997 | Yamadera et al. .................... 257/528 |

FOREIGN PATENT DOCUMENTS

| | | | |
|---|---|---|---|
| 5102155 | 4/1993 | Japan | .................... 438/355 |
| 5-235275 | 9/1993 | Japan . | |
| 5-327264 | 12/1993 | Japan . | |
| 7-286924 | 10/1995 | Japan . | |
| 7-307438 | 11/1995 | Japan . | |
| 8-8657 | 1/1996 | Japan . | |

Primary Examiner—Mahshid D. Saadat
Assistant Examiner—Jhihan B. Clark
Attorney, Agent, or Firm—Cushman Darby & Cushman IP group of Pillsbury Madison & Sutro LLP

[57] ABSTRACT

An improved on-chip type filter for filtrating electromagnetic noise is disclosed. Within a sensor chip are provided processing and amplifying circuits, a ground pad, a power pad and an output pad. Also, within the sensor chip are disposed low pass filters between the power pad, the outpad and the circuits to filtrate electromagnetic noise. The lengths of aluminum wires connecting the power pad, the output pad and the low pass filters are shorter than the lengths of aluminum wires connecting the ground pad and the low pass filters. The aluminum wires connecting the power pad or the output pad and the low pass filters are uncrossed wires, which do not cross any other wires.

25 Claims, 13 Drawing Sheets

SEMICONDUCTOR DEVICE THAT SUPPRESSES ELECTROMAGNETIC NOISE

CROSS REFERENCE TO RELATED APPLICATION

This application is based upon and claims the benefit of priority of the prior Japanese Patent Applications Nos. 7-193506 and 7-193507, the contents of which are incorporated herein by reference.

BACKGROUND OF THE INVENTION

1. Field of the Invention

The present invention generally relates to a semiconductor device provided with measures to counter electromagnetic noise, and more particularly to such a semiconductor device that is suitable to be mounted in a vehicle.

2. Related Arts

Recent progress in automotive electronics is remarkable. For example, to optimize the combustion in an engine, a microcomputer is used to detect the operational condition of the engine, to calculate the fuel injection rate and ignition timing according to the operational condition of the engine, and thereby to control the rate of fuel injection from an injector and the ignition timing. In constructing this electronic control system, the microcomputer, input/output circuits, etc. are packaged as an electronic control unit, and this electronic control unit is connected to a sensor group and an actuator group with a wiring harness. Here, the actuator group refers to the injector, an igniter, etc. and the sensor group refers to an engine speed sensor, a water temperature sensor, an intake air rate sensor, an intake pressure sensor, etc. Also in the intake pressure sensor, a semiconductor pressure sensor is used. This semiconductor pressure sensor has a plurality of strain gauges (piezo resistance elements) constructed of impurity diffusion layers on a silicon chip having a diaphragm and bridge-connection, and a signal processing circuit (integrated circuit) in the vicinity of the diaphragm on the silicon chip. The deformation of the diaphragm due to the action of pressure is detected as the resistance variation of the strain gauges from the bridge circuit, and the detected signal is amplified in the signal processing circuit. The thus amplified signal is sent to the electronic control unit through the wiring harness and reflects the fuel injection rate and the ignition timing.

In the midst of such progress in the automotive electronics, the suppression of electromagnetic noise (EMI) of vehicle-mounted electronic equipment is now an important issue. To reduce line noise as a measure to suppress electromagnetic noise, generally a feedthrough capacitor is used. One can describe the feedthrough capacitor by referring to the above-mentioned intake pressure sensor; through a stem in which the sensor chip is can-packaged are penetrated lead pins (for a power line and for a detection signal output line); in through holes of the lead pins in the grounded stem are respectively provided the feedthrough capacitors; noise is shut off or damped by the feedthrough capacitors in a noise propagation route leading to the signal processing circuit of the sensor chip through which noise propagates through the wiring harness, so that the signal processing circuit will not erroneously operate.

SUMMARY OF THE INVENTION

However, the parts of the feedthrough capacitor and the assembly thereof are so expensive that cost reduction is difficult. Under the circumstances, the inventors of the present invention have determined that on-chip type low pass filters constructed of resistors and capacitors should be provided between the circuits and pads within the sensor chip.

In this case, however, technology for the optimization of wiring related to the filters on the chip had not previously been established.

In view of the above, it is an object of the present invention to establish the optimization of wiring related to the filters for filtrating on-chip type electromagnetic noise.

The present invention is directed to a semiconductor integrated circuit device in which a circuit, a ground pad and a power pad or an output pad are provided within a semiconductor chip; also a filter for filtrating electromagnetic noise constructed of a resistor and a capacitor is interposed between the power pad or the output pad and the circuit, wherein the plan layout of a wire route connecting the power pad or the output pad and the filter for filtrating electromagnetic noise is set in such a manner that the resonance frequency in the wire route becomes higher than a frequency range of electromagnetic waves having electric field strength giving adverse influence to the operation of the circuit under the operating circumstance of this device.

To achieve this arrangement, in addition to a method in which the length of the wire route between the power pad or the output pad and the filter is made as short as possible so that the inductance component of the wiring route is reduced, a method is developed in which the wire route connecting the power pad or the output pad and the filter for filtrating electromagnetic noise is made to be an uncrossed wire which does not cross any other wire and thereby the capacitance component of the wiring route is effectively reduced.

That is, although electromagnetic noise propagates to the circuit from the pads to the filter for filtrating electromagnetic noise, the resonance frequency of the wire route is inversely proportional to the inductance component (L component). Then, by shortening the length of the wire route connecting the pad and the filter for filtrating electromagnetic noise, the L component is reduced, and the resonance frequency shifts to the high frequency side. Generally, when the resonance frequency shifts to the high frequency side, electromagnetic noise becomes lower in noise level. Therefore, the noise level of the electromagnetic noise in the shifted resonance frequency becomes lower, and the circuit is not so likely to operate erroneously.

Furthermore, although electromagnetic noise propagates to the circuit from the pads to the filter for filtrating electromagnetic noise, the resonance frequency of the wire route is inversely proportional to the capacitance component (C component). Then, as the wire route connecting the pad and the filter for filtrating electromagnetic noise does not cross any other wire, the C component formed in the wire route is reduced, and the resonance frequency shifts to the high frequency side. Generally, when the resonance frequency shifts to the high frequency side, electromagnetic noise becomes lower in noise level. Therefore, the noise level of the electromagnetic noise in the shifted resonance frequency becomes lower, and the circuit is not likely to operate erroneously.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

In the following paragraphs, an embodiment according to the present invention will be described referring to the appended drawings.

In this embodiment, the present invention is materialized as a semiconductor intake pressure sensor to be mounted in vehicles.

Figure 2:
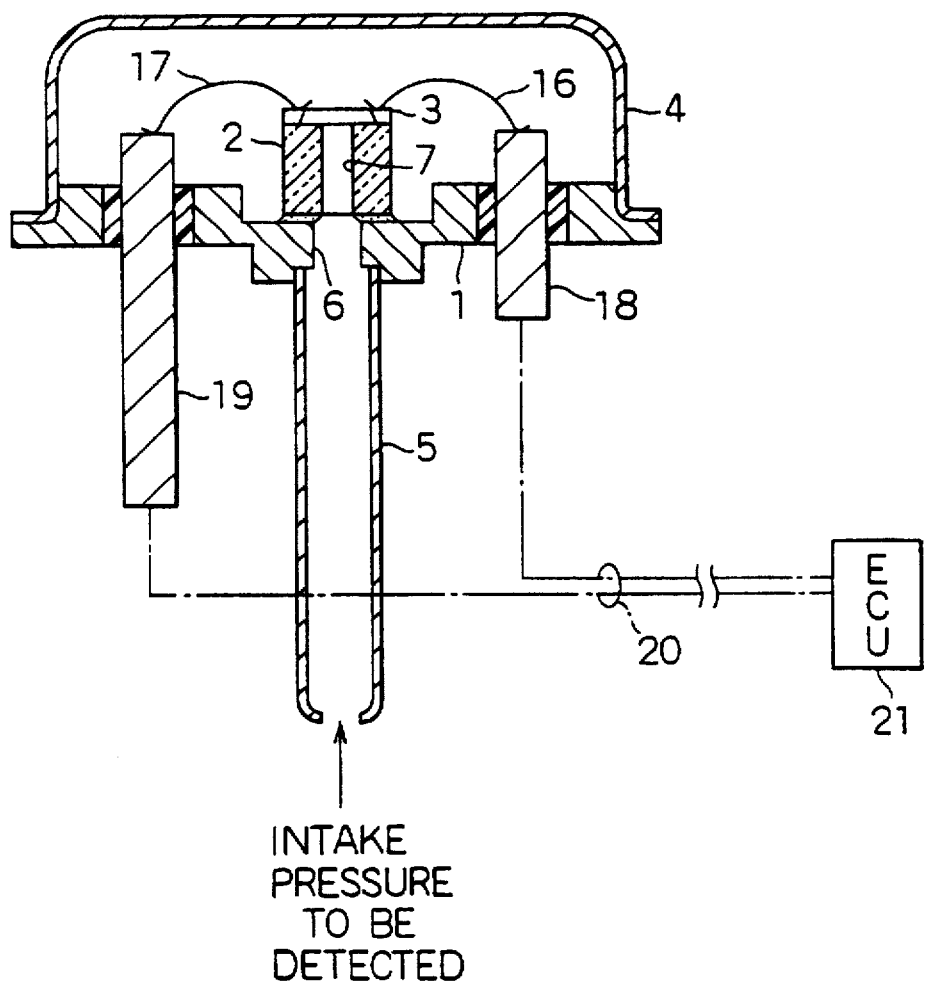
FIG. 2 is a cross-sectional view illustrating the entire construction of the sensor.

FIG. 2 illustrates the entire construction of the semiconductor intake pressure sensor. On top of a stem 1 is bonded pedestal 2 made of Pyrex glass in the central part. On top of the pedestal 2 is bonded a sensor chip (silicon chip) 3 as a semiconductor chip. On the outer circumferential part of the stem 1 is airtightly bonded a cover element (can) 4. To the stem 1 is connected a pressure conduction pipe 5 which conducts the intake pressure of an engine up to the bottom of the sensor chip 3 through a through hole 6 made in the stem 1 and a through hole 7 made in the pedestal 2.

Figure 1:
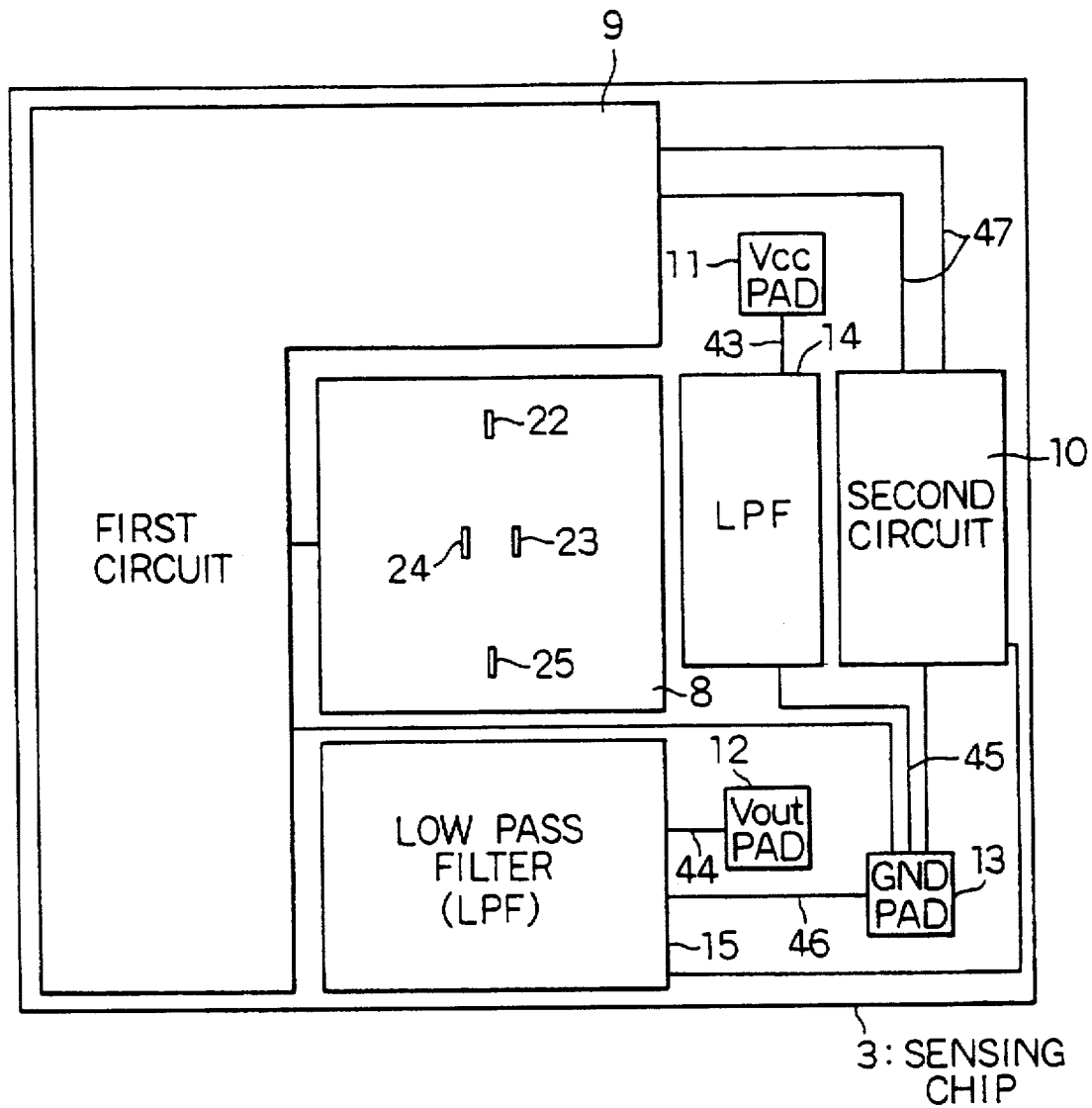
FIG. 1 is a plan view of a sensor chip showing a circuit arrangement according to an embodiment of the present invention.
Figure 3:
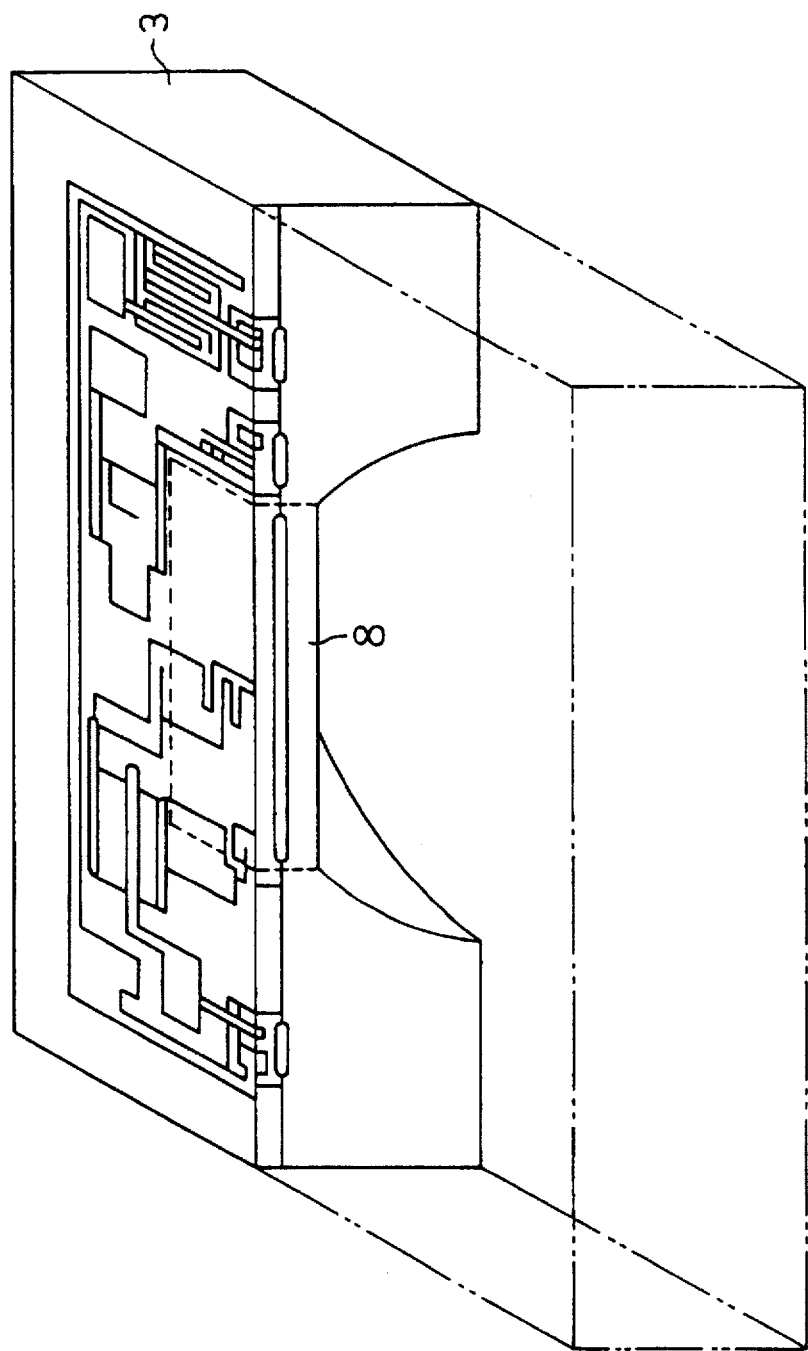
FIG. 3 is a perspective view of the sensor chip.

FIG. 3 is a perspective view of the sensor chip 3, and FIG. 1 is a plan view of the sensor chip 3. On the sensor chip 3 is formed a diaphragm 8 in the central part. To the bottom of the diaphragm 8 is applied the intake pressure of the engine described above. On the diaphragm 8 are formed strain gauges (piezo resistance elements) 22 through 25 made of impurity diffusion layers in such a way that the resistance values thereof vary in response to the deformation of the diaphragm 8. In the vicinity of the diaphragm 8 on the sensor chip 3 are formed a first circuit 9 and a second circuit 10 by way of integration in such a way that the variations in the resistance values of the strain gauges in response to the deformation of the diaphragm 8 can be converted into electric signals and concurrently amplified. Furthermore, around the diaphragm 8 in the sensor chip 3 are formed a power pad (Vcc PAD) 11, an output pad (Vout PAD) 12, a ground pad (GND PAD) 13 and low pass filters (LPFs) 14 and 15 as filters for filtrating electromagnetic noise. The power pad 11 is electrically connected to the second circuit 10 through the low pass filter 14, while the output pad 12 is electrically connected to the second circuit 10 through the low pass filter 15. Furthermore, the first circuit 9 and the second circuit 10 are electrically connected to each other.

As illustrated in FIG. 2, a power supply line, a ground line and an output line to the sensor chip 3 respectively are led out to the outside through bonding wires 16 and 17 and lead pins 18 and 19. The bonding wires 16 and 17 and the lead pins 18 and 19 are illustrated for two pieces respectively in FIG. 2. In actuality, however, the bonding wires and the lead pins are provided for three pieces respectively in correspondence to respective wiring.

Furthermore, the lead pins 18 and 19 are connected to an engine control unit (hereinafter referred to as "ECU") 21 through a wiring harness 20. The ECU 21 is constructed mainly of a microcomputer to detect the intake pressure by using signals from the sensor chip 3. Also, the ECU 21 detects the operational condition of the engine including the intake pressure, calculates fuel injection rate and ignition timing according to the operational condition of the engine, and controls the rate of fuel injection from an injector and the ignition timing. In FIG. 2, the injector, an igniter, etc. as actuator group components and an engine speed sensor, a water temperature sensor, an intake rate sensor, etc. as sensor group components are not illustrated.

Figure 4:
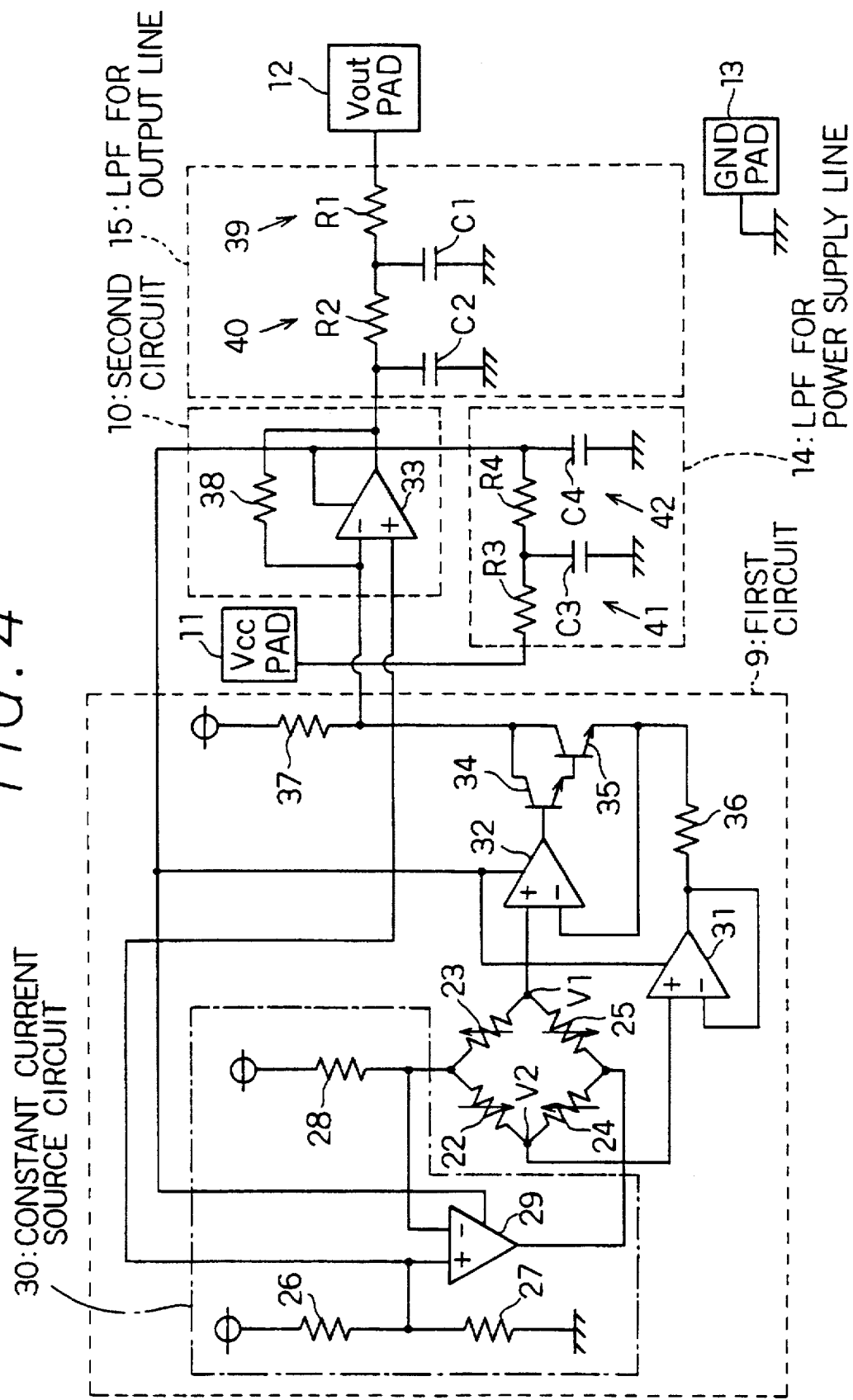
FIG. 4 is a circuit diagram of a pressure detection circuit part on the sensor chip.

Next, the circuitry of a pressure detection circuit part formed within the sensor chip 3 will be described referring to FIG. 4.

The strain gauges (piezo resistance elements) 22, 23, 24 and 25 formed on the diaphragm 8 are connected in full bridge. In this bridge circuit, a pair of diagonally positioned strain gauges 23 and 24 have resistance characteristics increasing in response to rise in pressure, while the other pair of diagonally positioned strain gauges 22 and 25 have resistance characteristics decreasing in response to rise in pressure.

To this bridge circuit is supplied constant current from a constant current circuit 30 constructed of resistors 26, 27 and 28, an operational amplifier 29, etc. In this construction, the current obtained by dividing the differential voltage between the reference voltage parted from the power voltage by the resistors 26 and 27 and the power voltage by the resistance value of the resistor 28 is supplied to the bridge circuit. Receiving a supply of the constant current, the bridge circuit outputs voltages V1 and V2 according to the pressure applied to the diaphragm 8.

These voltages V1 and V2 are differentially amplified and outputted, i.e., processed by a differential amplification circuit constructed of operational amplifiers 31, 32 and 33, transistors 34 and 35, resistors 36 through 38, etc. Specifically, to the non-inversion input terminal of the operational amplifier 32 is applied the voltage V1 from the bridge circuit, while to the inversion input terminal of the operational amplifier 32 is applied the voltage V2 from the bridge circuit through the operational amplifier 31 and the resistor 36 both functioning as a buffer. Both the input voltages are differentially amplified by the operational amplifier 32, and the transistors 34 and 35 are controlled by the output voltage from the operational amplifier 32. By this operation, the output voltages (V1–V2) from the bridge circuit are converted into current output. The current-converted current output is amplified by the operational amplifier 33, etc. and outputs pressure detection signal to the output pad 12. The operational amplifier 33 and the resistor 38 jointly construct the second circuit 10 illustrated in FIG. 1.

Between the output terminal of the operational amplifier 33 and the output pad 12 is provided the output system low pass filter 15 to filtrate electromagnetic noise. To be more specific, between the output pad 12 and the circuit 10 are disposed in series a primary CR filter 39 and a secondary CR filter 40. The primary filter 39 of the output system is constructed of a resistor R1 and a capacitor C1, while the secondary filter 40 of the output system is constructed of a resistor R2 and a capacitor C2.

On the other hand, to the power pad 11 is connected the power system low pass filter 14 to filtrate electromagnetic noise. The power filtrated by this low pass filter 14 is supplied to the operational amplifiers 33, 32, 31 and 29, etc. To be more specific, between the power pad 11 and the circuit 10 are disposed in series a primary CR filter 41 and a secondary CR filter 42. The power system primary filter 41 is constructed of a resistor R3 and a capacitor C3, while the power system secondary filter 42 is constructed of a resistor R4 and a capacitor C4.

As illustrated in FIG. 1, the power pad 11 is connected to the low pass filter 14 with an aluminum wire 43, the output pad 12 is connected to the low pass filter 15 with an aluminum wire 44, and the ground pad 13 is connected to the low pass filter 14 with an aluminum wire 45 and to the low pass filter 15 with an aluminum wire 46.

Figure 5:
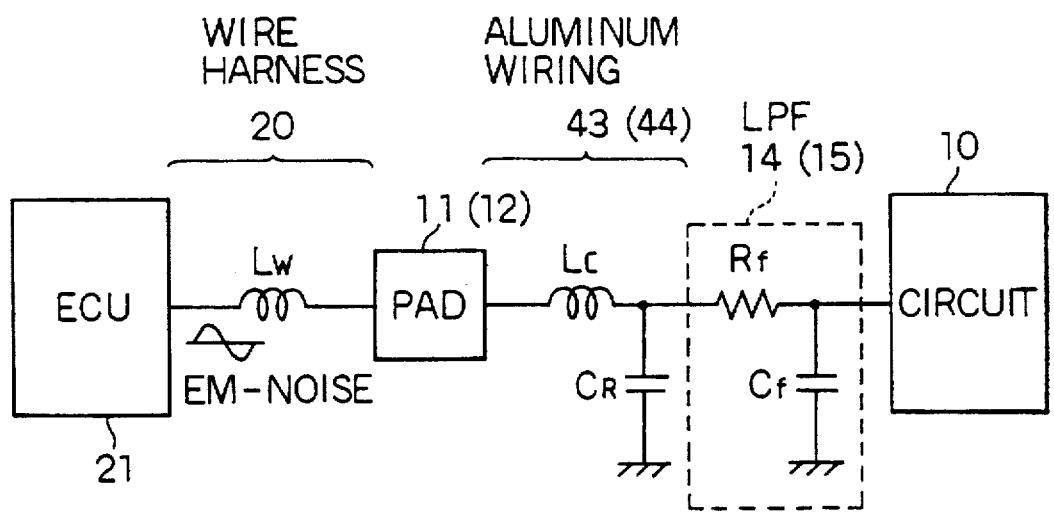
FIG. 5 is an equivalent circuit diagram for use in describing the propagation route of line noise.

Here, by using an equivalent circuit illustrated in FIG. 5, the propagation route of line noise will be described. To the ECU 21 is connected the pad 11 (12) through the wiring harness 20 (actually the lead pins 18 and 19 and the wires 16 and 17 are included), to the pad 11 (12) is connected the low pass filter 14 (15) with the aluminum wire 43 (44), and to the low pass filter 14 (15) is connected a circuit 10. Here, by on-chip forming the low pass filter 14 (15), unlike a case where a feedthrough capacitor is used, it is assumed that a CR circuit has been parasitically formed with the aluminum wire 43 (44) between the pad 11 (12) and the low pass filter 14 (15). That is, a circuit containing $L_C$ components and $C_R$ components has been formed.

Also, it is assumed that electromagnetic noise invades the pad 11 (12) to the chip through $L_W$ components of the wiring harness 20.

If electromagnetic noise enters externally, such a point that the entering noise resonates at the proper value associated with the propagation route exists ahead of the filter. The resonance frequency is expressed by the following equation:

$$f = \frac{1}{2\pi\sqrt{(L_W + L_C)C_R}} \quad (1)$$

Figure 6:
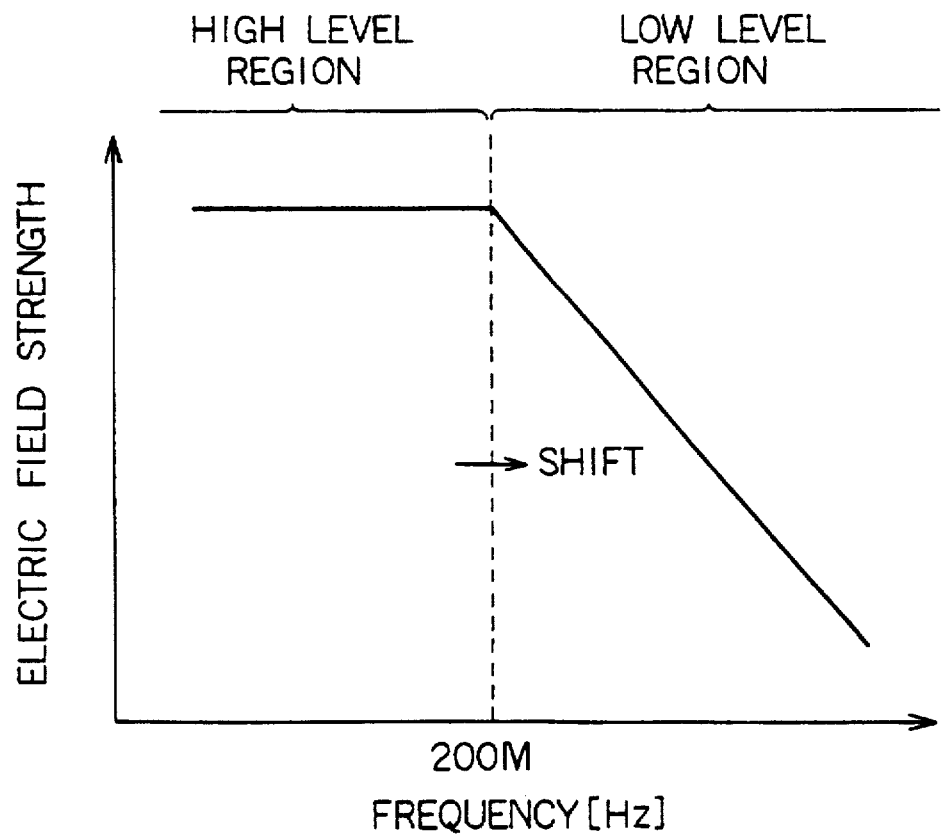
FIG. 6 is a graph illustrating the relationship between frequency and electric field strength.

From the equation (1), it is understood that when $L_C$ and $C_R$ become smaller, the resonance frequency f shifts to the high frequency side. That is, as illustrated in FIG. 6, by reducing the L components and C components within the chip, the electric field strength (noise characteristics) can be shifted to the high frequency side. Here, the electric field strength of electromagnetic noise is divided into a higher level region and a lower level region bounded by 200 MHz. Specifically, the sensor requires a threshold electric field strength of 50V/m for 23 to 50 MHz and 100V/m for 88 to 144 MHz, for example. The range of 23 to 50 MHz has been allocated to land mobile radio in the United States, while the range of 88 to 144 MHz has been allocated to FM broadcasting and land mobile radio in Japan. Therefore, it is necessary to design the $L_C$ and $C_R$ of the wire 43 (44) in such a way that the resonance frequency can be set on the high frequency side from at least 144 MHz (preferably 200 MHz).

In view of the above, in this embodiment of the present invention, as illustrated in FIG. 1, the lengths of the respective aluminum wires 43 and 44 between the pads 11 and 12 and the low pass filters 14 and 15 are made shorter as much as possible. Specifically, referring to the wires 45 and 46 connected to the ground pad 13, the lengths of the aluminum wires 43 and 44 are made shorter than the lengths of the aluminum wires 45 and 46, respectively.

Figure 7:
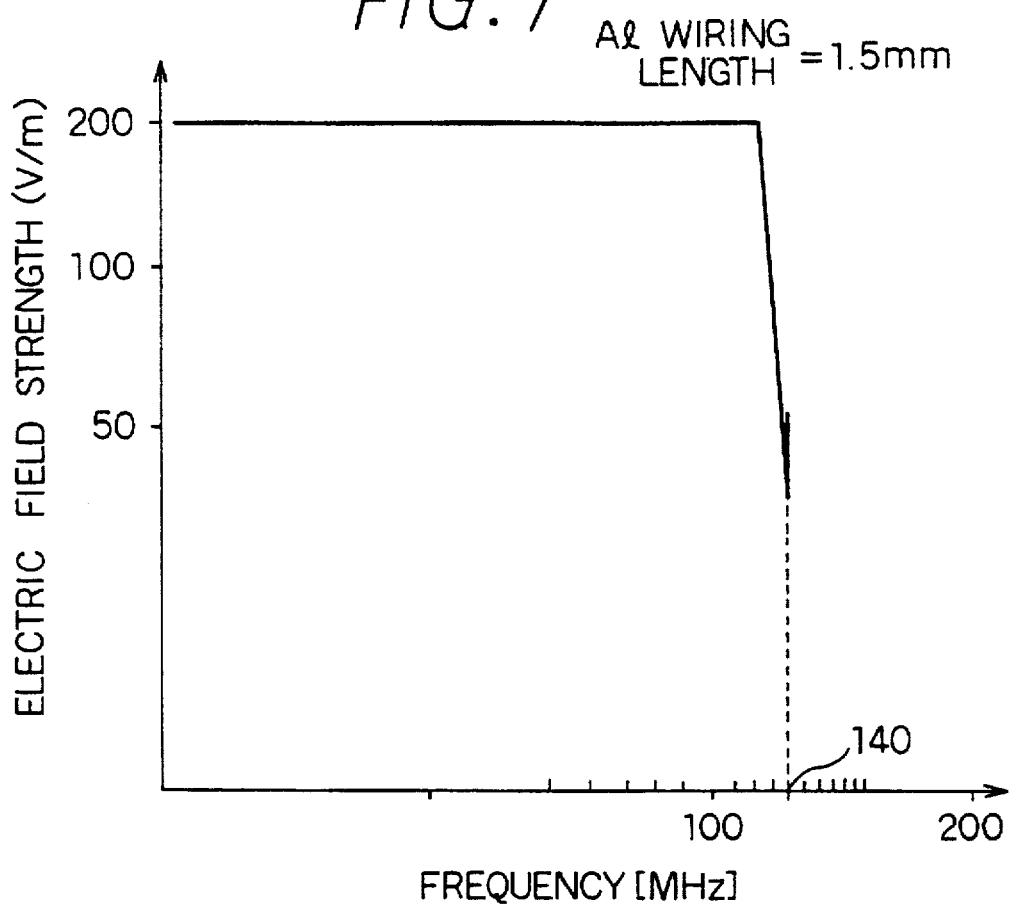
FIG. 7 is a graph illustrating the measurement results of the electric field strength.
Figure 8:
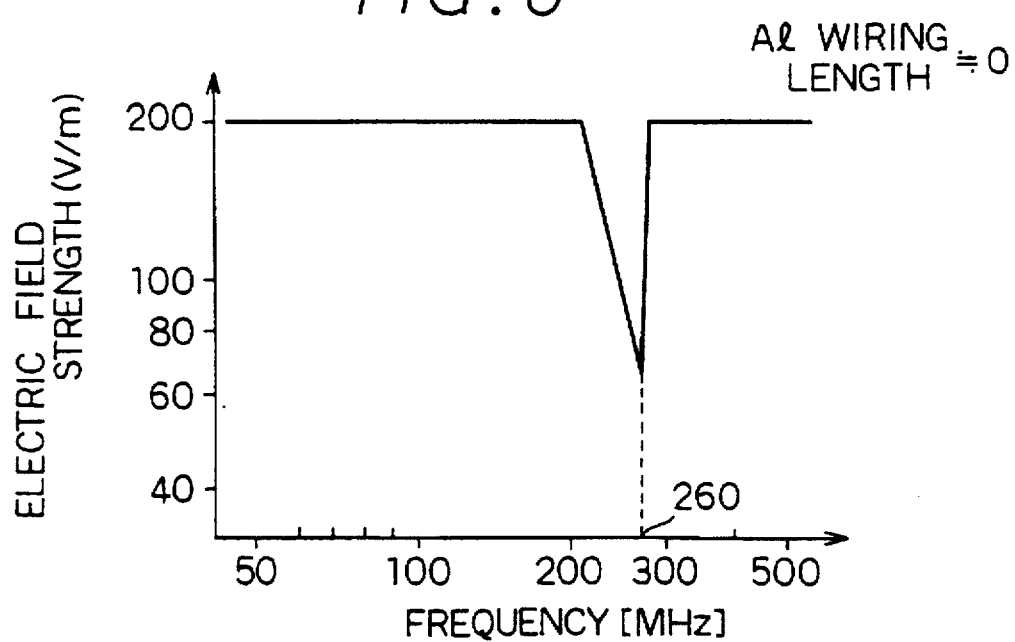
FIG. 8 is a graph illustrating the measurement results of the electric field strength.

FIGS. 7 and 8 illustrate the results of the measurement of electric field strength related to the wire lengths between the pads 11 and 12 and the low pass filters 14 and 15, respectively. The measurement was made in a TEM (transverse electromagnetic) cell (electromagnetic wave generating tank) test. FIG. 7 treats a case with the aluminum wire length of 1.5 mm, while FIG. 8 treats the aluminum wire length infinitely approximated to "0." In FIGS. 7 and 8, the frequency is taken as abscissa, and the electric field strength is taken as ordinate. To obtain the test results illustrated in FIGS. 7 and 8, all the sensors used were the same in characteristics (e.g., filter constant) except for the aluminum wire lengths between the pads and the low pass filters.

From FIGS. 7 and 8, erroneous operations were recognized in the circuit at 140 MHz in case of FIG. 7 and at 260 MHz in case of FIG. 8. As evident from FIGS. 7 and 8, by shortening the aluminum wires, the resonance frequency can be shifted to an rarely used region above 200 MHz (where there is no strong radio wave). Here, it should be noted that in FIG. 7, the electric field strength was not raised above 145 MHz for the reason that the circuit had been broken to an unmeasurable extent.

Also, in this embodiment, as illustrated in FIG. 1, the second circuit 10 and the first circuit 9 are electrically connected with aluminum wires 47 without crossing any other wire. This manner of wiring can produce such effects as described below.

Figure 9:
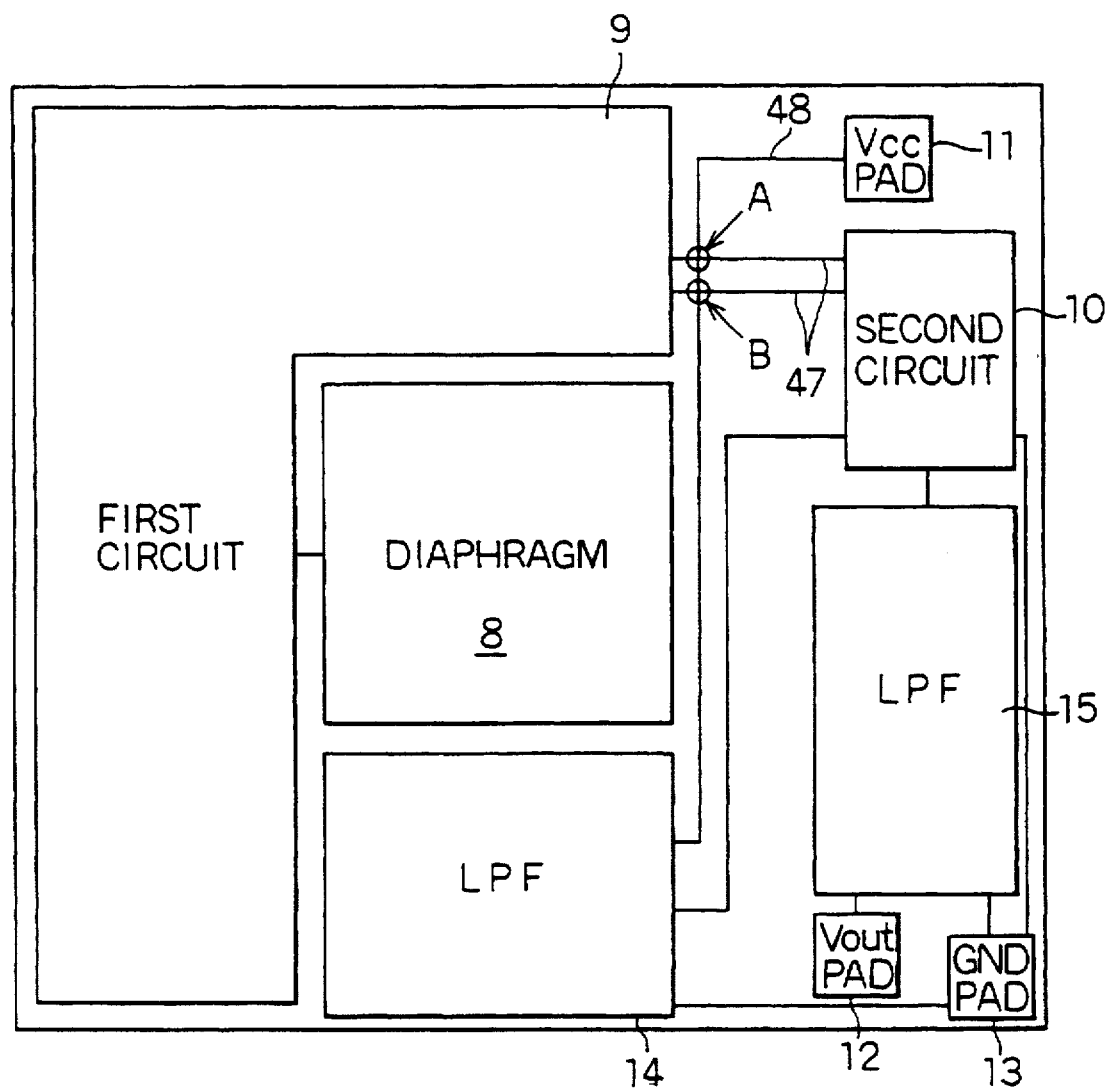
FIG. 9 is a plan view of the sensor chip for use in comparison.
Figure 10A:
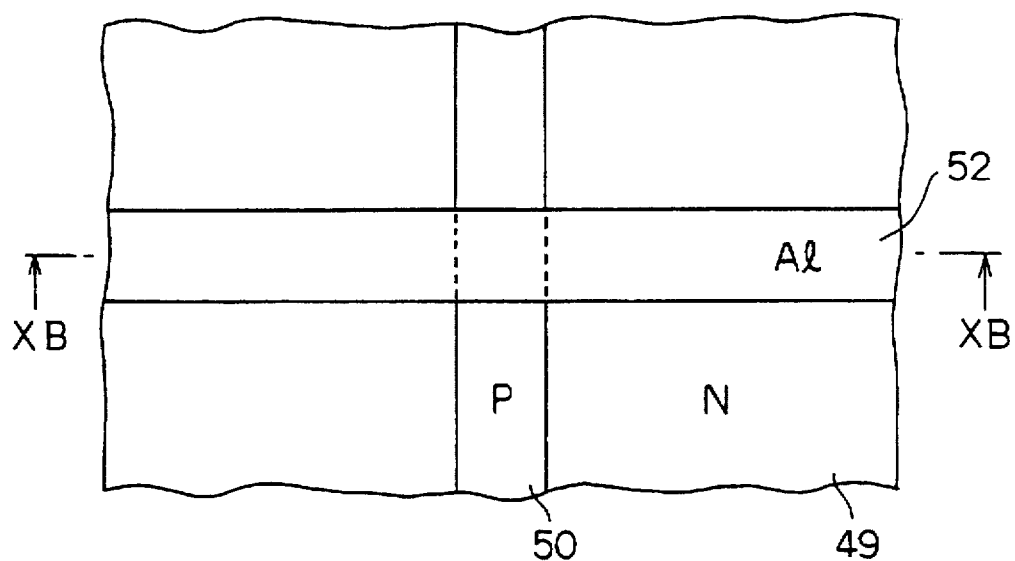
FIG. 10A is a plan view of the sensor chip for use in describing the cross wiring.
Figure 10B:
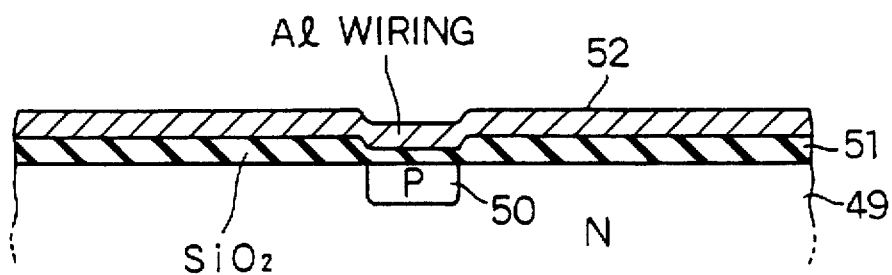
FIG. 10B is a cross-sectional view taken along line XB—XB of FIG. 10A.

As illustrated in FIG. 9, when the aluminum wires 47 electrically connecting the second circuit 10 and the first circuit 9 cross the aluminum wire 48 electrically connecting the power pad 11 and the low pass filter 14, the impurity diffusion layer and the aluminum wires cross each other at the intersecting points A and B as illustrated in FIGS. 10A and 10B. Specifically, in FIGS. 10A and 10B, a P-type layer 50 is extendedly disposed on the surface layer part of an N-type silicon substrate 49, a silicon oxide film 51 is disposed on the N-type silicon substrate 49, and an aluminum wire 52 is extendedly disposed on the silicon oxide film 51.

When the wires, or aluminum wires and diffusion wire, are crossed each other as illustrated in FIGS. 9, 10A and 10B, the silicon oxide film 51 becomes thinner at the crossing part, and the capacitance component $C_R$ (FIG. 5) of the wire between the power pad 11 (output pad 12) and the low pass filter 14 (15) becomes larger. As a result, when the capacitance component $C_R$ becomes larger in the equation (1) above, the resonance frequency f shifts to the low frequency side, and therefore shifts into the high level region below 200 MHz in FIG. 6, and the circuit becomes highly likely to operate erroneously.

However, according to this embodiment, as the aluminum wire routes do not crossed each other, the resonance frequency f is shifted to the high frequency side by reducing the capacitance component $C_R$ in the wiring, further shifted to the low level region of 200 MHz or more in FIG. 6, and thereby the erroneous operations of the circuit can be prevented.

Figure 11:
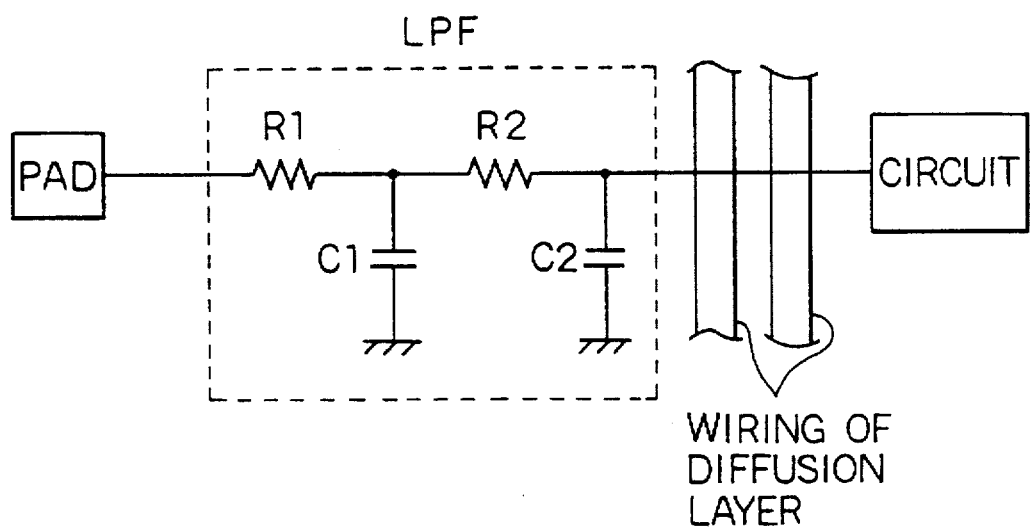
FIG. 11 is a view for use in describing the crossing between aluminum wires and diffusion wires.
Figure 12:
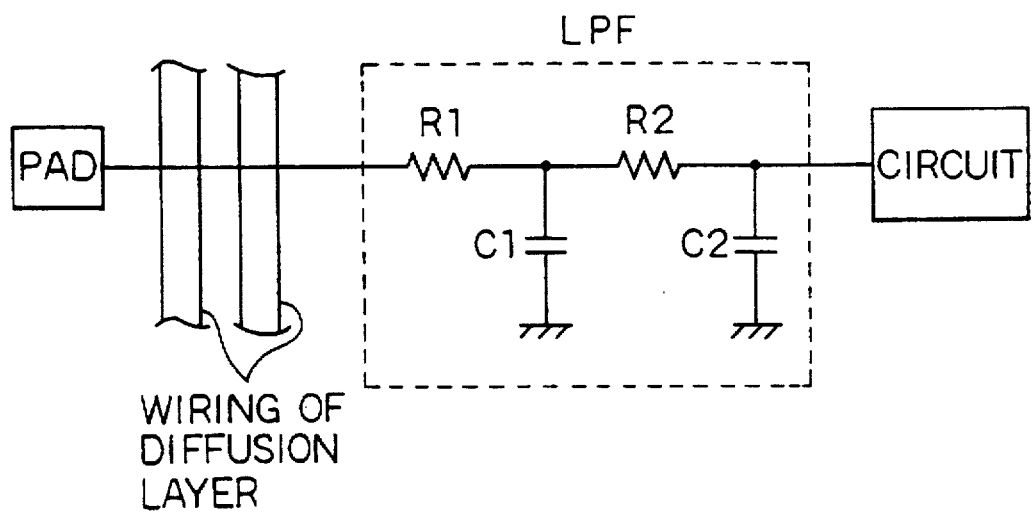
FIG. 12 is a view for use in describing the crossing between aluminum wires and diffusion wires.

Furthermore, referring to the crossing of the aluminum wires, as illustrated in FIG. 11, if the wires of diffusion layer cross the aluminum wire between the low pass filter and the circuit, the crossing part is on the downstream side from the low pass filter. Therefore, even if damped noise is capacitively coupled, as the noise has been damped, the invasion of such noise into the circuit would pose no problem. On the other hand, as illustrated in FIG. 12, if the wires of diffusion layer cross the aluminum wire between the pad and the low pass filter, the crossing part is on the upstream side from the low pass filter. Therefore, undamped noise is capacitively coupled and invades the circuit. That is, the capacitance component $C_R$ of the wire that contributes to the resonance frequency becomes larger. Accordingly, in this embodiment, it is so arranged that the wire between the pad and the low pass filter does not cross any other wiring.

In addition, this embodiment is provided with a contrivance as described below.

Figure 13:
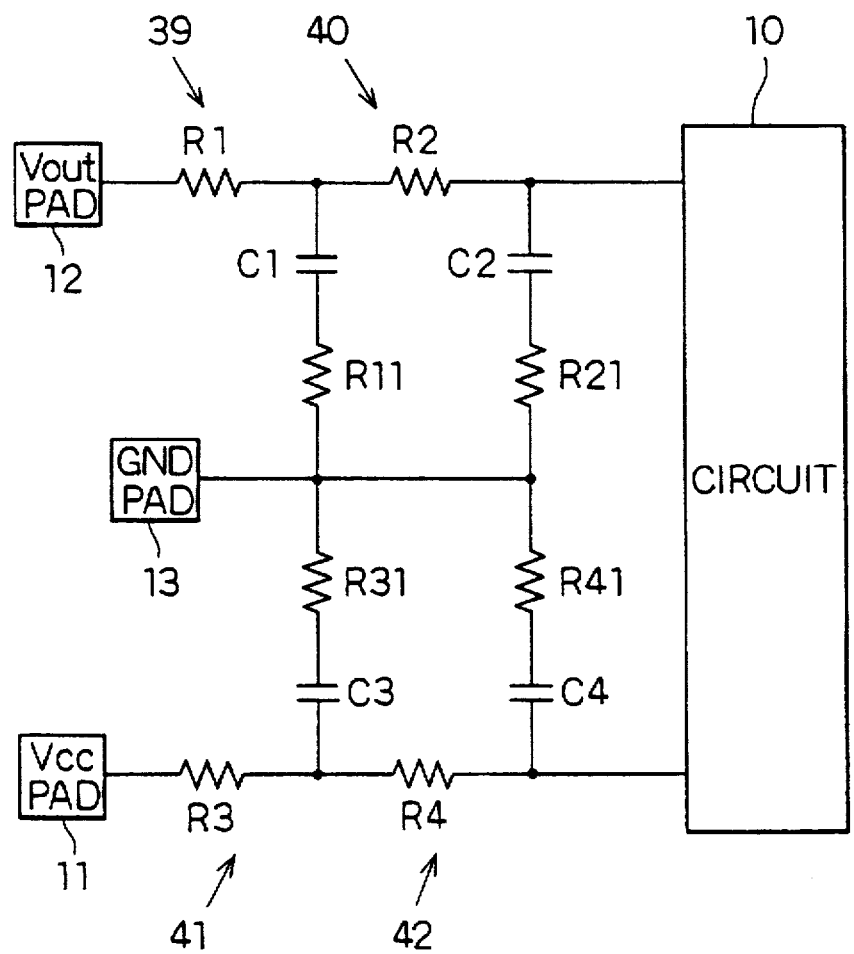
FIG. 13 is an equivalent circuit diagram of low pass filters including a ground pad.

FIG. 13 illustrates the equivalent circuit of the low pass filters 14 and 15 including the ground pad 13. As illustrated in this figure, between the output pad 12 and the circuit 10 are connected in series the primary filter 39 constructed of R1 and C1 and the secondary filter 40 constructed of R2 and C2, between the power pad 11 and the circuit 10 are connected in series the primary filter 41 constructed of R3 and C3 and the secondary filter 42 constructed of R4 and C4, and to the capacitors C1, C2, C3 and C4 of the respective filters 39, 40, 41 and 42 are connected the ground pad 13 respectively. In this arrangement, in the wiring arrangement, between the capacitors C1, C2, C3 and C4 and the ground pad 13 are disposed parasitic resistance components $R_{11}$, $R_{21}$, $R_{31}$ and $R_{41}$. To make these resistance components smaller, the wire lengths (i.e., lengths of the aluminum wires 45 and 46 in FIG. 1) are made shorter as much as possible while keeping the above-mentioned design rule.

Specifically, the cut-off frequency $f_c$ of the low pass filter is given by:

$$f_c \propto \frac{1}{Rx + R_{x1}} \quad (2)$$

Accordingly, by making the resistance component smaller, the cut-off frequency $f_c$ is shifted to the low frequency side, and thereby the resistance to electromagnetic noise is strengthened.

As described above, according to this embodiment, in the semiconductor sensor equipped with the on-chip type low pass filters 14 and 15 for filtrating the electromagnetic noise, the lengths of the aluminum wires 43 and 44 connecting the power pad 11 or the output pad 12 and the low pass filters 14 and 15 are made shorter than the lengths of the aluminum wires 45 and 46 connecting the ground pad 13 and the low pass filters 14 and 15 (more specifically, the capacitors C1 through C4 in the low pass filters 14 and 15). In this arrangement, although the electromagnetic noise propagates from the power pad 11 or the output pad 12 to the circuits 9 and 10 through the aluminum wires 43 and 44 and the low pass filters 14 and 15 respectively, as the resonance frequency f of the aluminum wires 43 and 44 is in inverse proportion to the L component as indicated in the equation (1), by making the aluminum wires 43 and 44 connecting the power pad 11 or the output pad 12 and the low pass filters 14 and 15 shorter, the L components are made smaller, and the above-described resonance frequency f shifts to the high frequency side. On the other hand, as illustrated in FIG. 6, when the electromagnetic noise is shifted to the high frequency side, the noise level becomes lower, and as a result, the noise level at the shifted resonance frequency becomes lower, and the circuits 9 and 10 become less likely to operate erroneously operations.

Furthermore, an uncrossed wiring is provided in which the aluminum wires 43 and 44 connecting the power pad 11 or the output pad 12 and the low pass filters 14 and 15 do not cross any other wire. In this arrangement, although the electromagnetic noise propagates from the power pad 11 or the output pad 12 to the circuits 9 and 10 through the aluminum wires 43 and 44 and the low pass filters 14 and 15 respectively, as the resonance frequency f of the aluminum wires 43 and 44 is in inverse proportion to the C component as indicated in the equation (1), the C components formed between the aluminum wires 43 and 44 and other wires become smaller by providing the uncrossed wiring, and the resonance frequency f shifts to the high frequency side. As illustrated in FIG. 6, when the electromagnetic noise is shifted to the high frequency side, the noise level becomes lower, and as a result, the noise level at the shifted resonance frequency becomes lower, and the circuits 9 and 10 become less likely to operate erroneously.

By making the best use of the wiring technology for such noise filters formed on the chip, the wiring can be optimized.

Figure 14A:
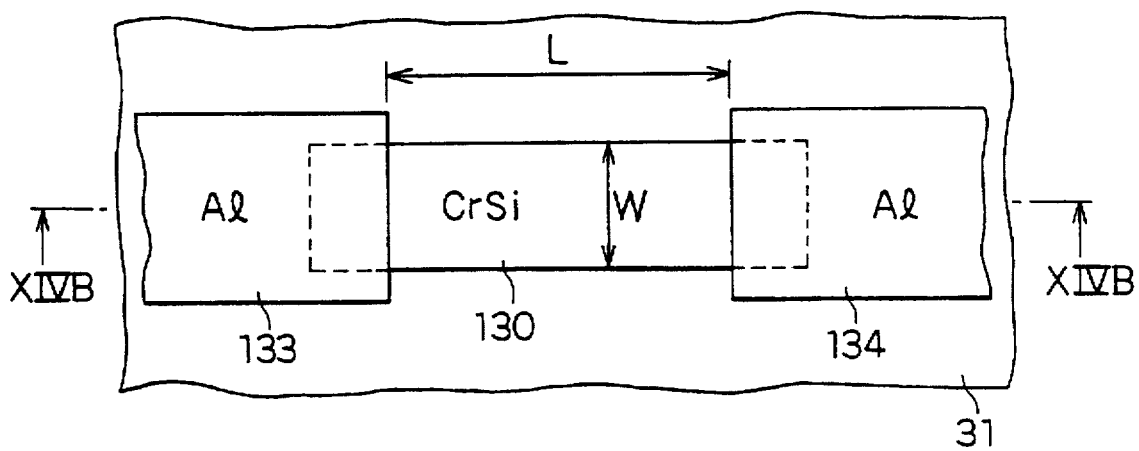
FIG. 14A is a plan view illustrating a CrSi resistor constructing a CR filter.
Figure 14B:
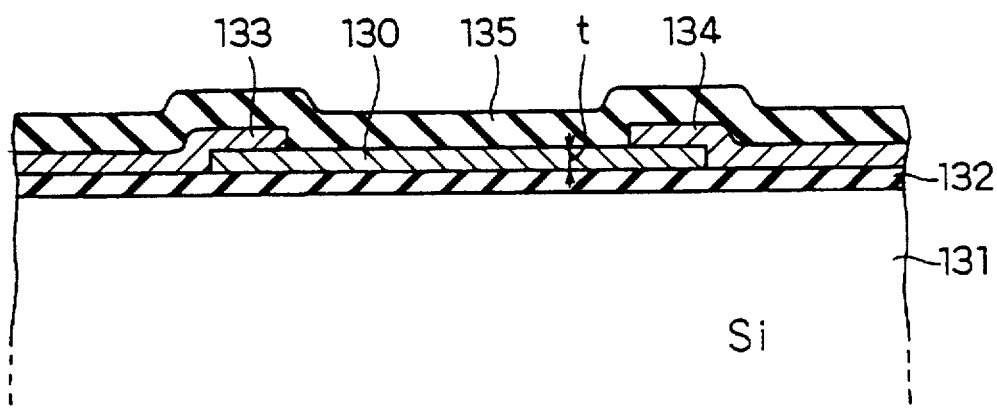
FIG. 14B is a cross-sectional view taken along line XIVB—XIVB of FIG. 14A.

The resistances R1, R2, R3 and R4 constructing the low pass filters 14 and 15 are made of CrSi thin-film resistors 130 illustrated in FIGS. 14A and 14B. More specifically, on top of a silicon substrate (silicon chip) 131 is formed a silicon oxide film 132, and on the silicon oxide film 132 is disposed the strip-patterned CrSi thin-film resistor 130. The CrSi thin-film resistance 130 is connected to aluminum wires 133 and 134. The silicon substrate 131 is covered therethroughout with a passivation film 135 of silicon oxide. Here, the thickness, width and length of the CrSi thin-film resistance 30 is t, W and L respectively.

Here, it may be possible to form the filter-constructing resistor with a diffusion resistor. However, as a result of a test conducted by the inventors of the present invention, it was found that a large current would flow through the low pass filter provided within the sensor. If the resistor is formed with a diffusion layer within the substrate, such large current may adversely influence the circuit elements in the vicinity thereof. To prevent such problem, the CrSi thin-film resistor is employed instead of the resistor constructed of a diffusion layer.

As described above, in FIG. 4, electromagnetic noise (inductive noise) from the power pad 11 and the output pad 12 invades the circuits 10 and 9. The inductive noise is damped by the low pass filters 14 and 15 (39 through 42) without affecting the peripheral circuitry. At this time, a high frequency current flows through the CrSi thin-film resistors 130 (R1 through R4) and may fuse these resistors.

In order to prevent such fusion of the CrSi thin-film resistors 130, the cross-sectional area of the CrSi thin-film resistor 130 is determined.

Figure 15:
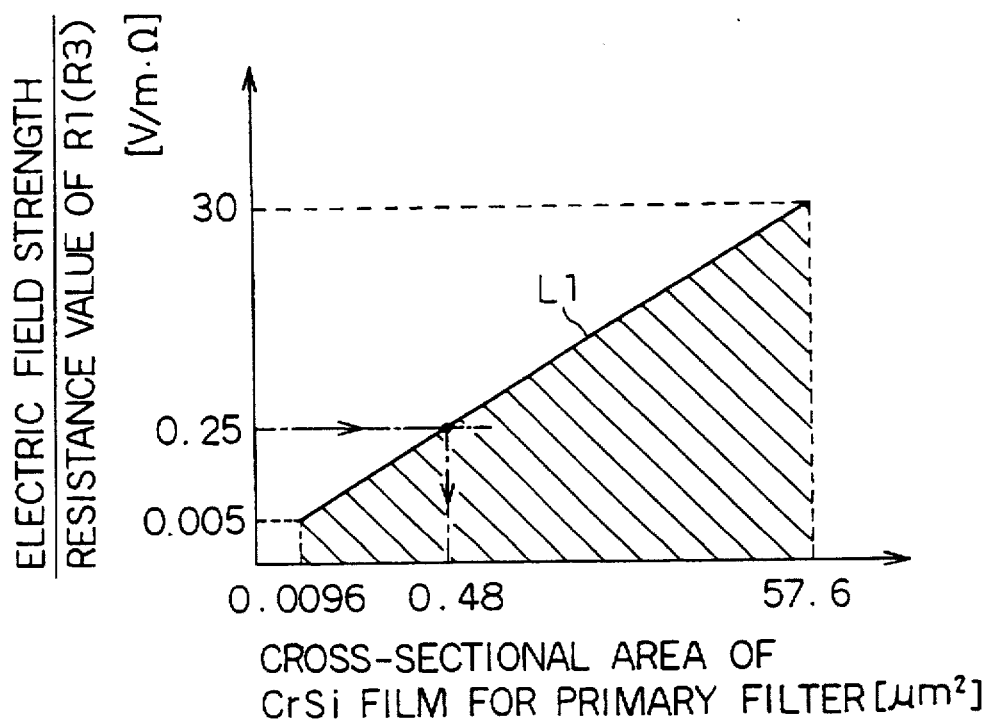
FIG. 15 is a graph illustrating the measurement results for use in determining the cross-sectional area of the CrSi resistor in a primary filter.
Figure 16:
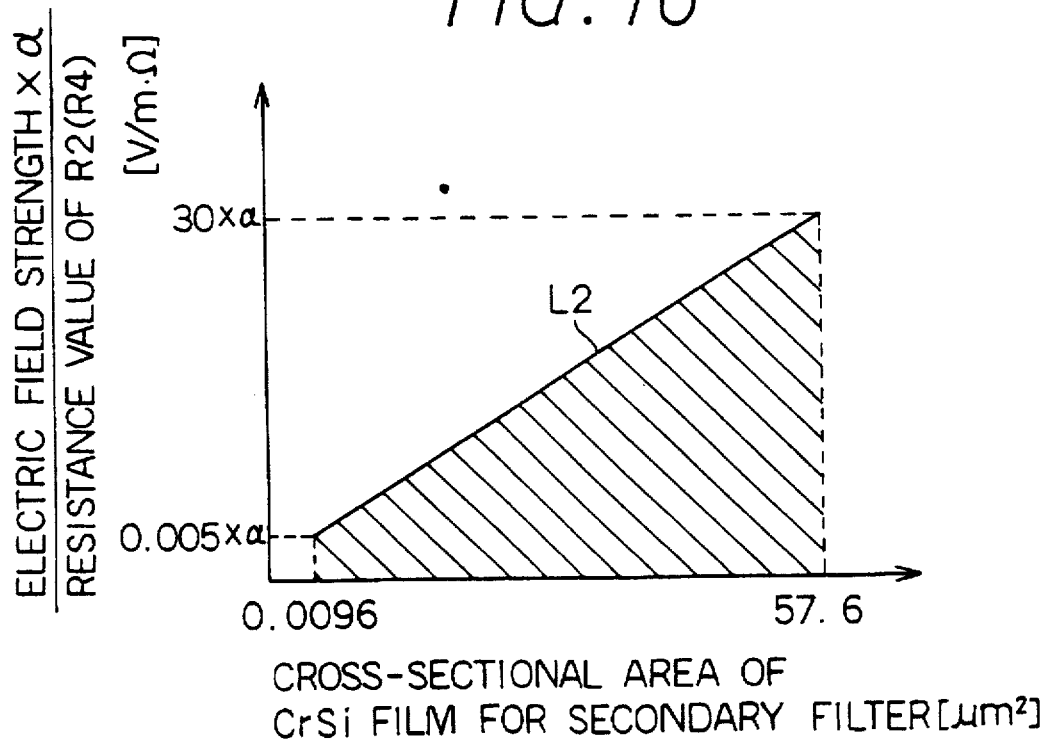
FIG. 16 is a graph illustrating the measurement results for use in determining the cross-sectional area of the CrSi resistor in a secondary filter.

FIGS. 15 and 16 illustrate the results of a test conducted to determine the cross-sectional area of the CrSi thin-film resistor 130. In FIG. 15, the value obtained by dividing the electric field strength by the resistance value R1 (or R3) is taken as ordinate, and the cross-sectional area of the CrSi thin-film resistor 130 of the primary filter 39 or 41 is taken as abscissa. In FIG. 15, the boundary line L1 is a line linking the minimum values of the respective cross-sectional areas of the CrSi thin-film resistor 130 which do not cause fusion with respect to the respective electric field strengths. The boundary line L1 is a linear function in relations between the electric field strength and the cross-sectional area of the CrSi thin-film resistor 130. The side under the boundary line L1 (shadowed area) is a safe region in which fusion does not occur.

In FIG. 16, the value obtained by multiplying the electric field strength by the damping ratio α due to the primary filters 39 and 41 and then divided by the resistance value R2 (or R4) is taken as ordinate, and the cross-sectional area of the CrSi thin-film resistor 130 of the secondary filter 40 or 42 is taken as abscissa. In FIG. 6, the boundary line L2 is a line linking the minimum values of the respective cross-sectional areas of the CrSi thin-film resistor 130 which do not cause fusion with respect to the respective electric field strengths. The boundary line L2 is a linear function in relations between the electric field strength and the cross-sectional area of the CrSi thin-film resistor 130. The side under the boundary line L2 (shadowed area) is a safe region in which fusion does not occur.

As illustrated in FIG. 15, to make a filter of such specifications that R1=200Ω and the electric field strength of 50V/m, for example (when it is so hypothesized that the electric field strength of 50V/m, the largest as an electromagnetic noise, works), the point of intersection of the boundary line L1 with respect to 50/200=0.25 is obtained. Then, the cross-sectional area at this point of intersection is 0.48 μm². Therefore, the cross-sectional area of the CrSi thin-film resistor 130 is set to 0.48 μm². In other words, in FIGS. 14A and 14B, on the condition that the thickness t is constant, by adjusting the width W, the cross-sectional area (=t·W) is set to 0.48 μm². At this time, by concurrently adjusting the length L, the resistance value is left as it is as the designed value.

Furthermore, as the high frequency current is damped by the primary filters 39 and 41, the damping ratio α of the primary filters obtained beforehand is multiplied by the then specifications (the electric field strength of 40V/m in the above-described example), and the products is divided by the resistance value R2 (or R4), and the point of intersection with the boundary line L2 with respect to this value is obtained. Then, the CrSi thin-film resistor 130 with the cross-sectional area that should be at this point of intersection is formed. That is, in FIGS. 14A and 14B, on the condition that the thickness t is constant, by adjusting the width W, the cross-sectional area (=t·W) is set to the value on the boundary line L2. At this time, by concurrently adjusting the length L, the resistance value is left as it is as the designed value.

Here, the range of the electric field strength (both ends of the respective boundary lines L1 and L2) is 5V/m to 300V/m according to the specifications for automotive sensors, and the range of the resistance values, based on the voltage drop of the power system (e.g., 0.5V) and the area of the capacitors that can be laid out within the chip, is set to 10Ω to 1,000Ω. That is, the numerical value range of the ordinate in FIG. 15 is set to 0.005 (=5/1,000) to 30 (=300/10).

As described above, according to this embodiment, the thin-film resistor 130 is used as a resistor for constructing an on-chip type filter for filtrating the electromagnetic noise. If a resistor is constructed of an impurity diffusion layer and a large current flows therethrough, circuit elements in the vicinity thereof may be adversely influenced by such large current. However, as the resistor according to this embodiment does not employ any impurity diffusion layer, such problem can be avoided.

Furthermore, according to the embodiment, the thin-film resistor 130 is made of a preferable material CrSi. This means that the CrSi thin-film resistor 130 is high in resistance, low in temperature characteristics (with a little variation in resistance value due to the variation in temperature) and high in moisture resistance.

Furthermore, the cross-sectional area of the thin-film resistor 130 is set to be within the safe region sectioned by the boundary lines L1 and L2, each expressed as a linear function of the current flowing through the thin-film resistor 130 due to electromagnetic noise. That is, as the fusion area is in proportion to the current flowing therethrough and such current is in proportion to the electric field strength, the fusion area is in proportion to the electric field strength. By making use of this fact, the cross-sectional area is set to be within the safe region sectioned by the boundary lines L1 and L2, each expressed as a linear function of the current flowing through the thin-film resistor 130 due to electromagnetic noise. Therefore, the thin-film resistor 130 is not fused by a large current. Here, as the boundary lines L1 and L2 for sectioning the non-fusing region are expressed as linear functions, a region in which the thin-film resistor 130 will not be fused can easily be specified.

Now, referring to the fact that the boundary lines L1 and L2 are expressed as linear functions in the relations between the electric field strength and the cross-sectional area of the CrSi thin-film resistor 130, the electric power (induced electromotive force) P can be expressed as $P=VI=I^2R$, and the induced electromotive force should be in proportion to the second power of the current I. However, from the results of the test illustrated in FIGS. 15 and 16, it was found that the induced electromotive force was in proportion to the first power of the current I (electric field strength). This is presumably because of Meissner effect.

Moreover, a large current may easily flow due to electromagnetic noise. However, the employment of the construction of this embodiment can solve this problem.

In addition, when the cross-sectional area of the CrSi thin-film resistor 130 is adjusted, although the width W is varied on the condition that the thickness t is constant, the cross-sectional area thereof may be adjusted by adjusting the thickness t.

Also, the values on the boundary lines L1 and L2 in FIGS. 15 and 16 are used, these values are not always needed to be on the boundary lines L1 and L2 but may be within the safe region sectioned by the boundary lines L1 and L2. However, it should be noted that the use of the values on the boundary lines L1 and L2 can minimize the area occupied by the CrSi thin-film resistor 130 when the cross-sectional area thereof is varied by using the width W.

So far the semiconductor pressure sensor has been described herein. However, the present invention should not be limited to the semiconductor pressure sensor but may also be applied to such an electronic component that is connected with wires and through which line noise propagates (what is called a "stand-alone type electronic component", and more specifically, an electronic component with a circuit part within the chip).

In the above-described embodiment, description was given to the crossing of aluminum wires and impurity wires as a case where wires cross each other. However, the present invention should not be limited to such crossing but may also be applied to a case where thin-film wires with an insulating film are three-dimensionally arranged, or in short, where wires cross each other three-dimensionally. Here, it should be noted that the wires are not always constructed of wire materials but also refer to wires at large, including resistors, through which current flows and a capacitance component is formed.

In the above embodiment, measures are taken to counter electromagnetic waves which poses a problem in the present situation. In case of cellular phone (800 MHz), vehicle information and communication system VICS (1~several GHz), millimeter wave radar (several 10 GHz), etc. which are used in the frequency region exceeding 200 MHz, if the electric field strength is problematic, this problem can be solved by designing the resonance frequency to be correspondent to the frequency in use.

Figure 17:
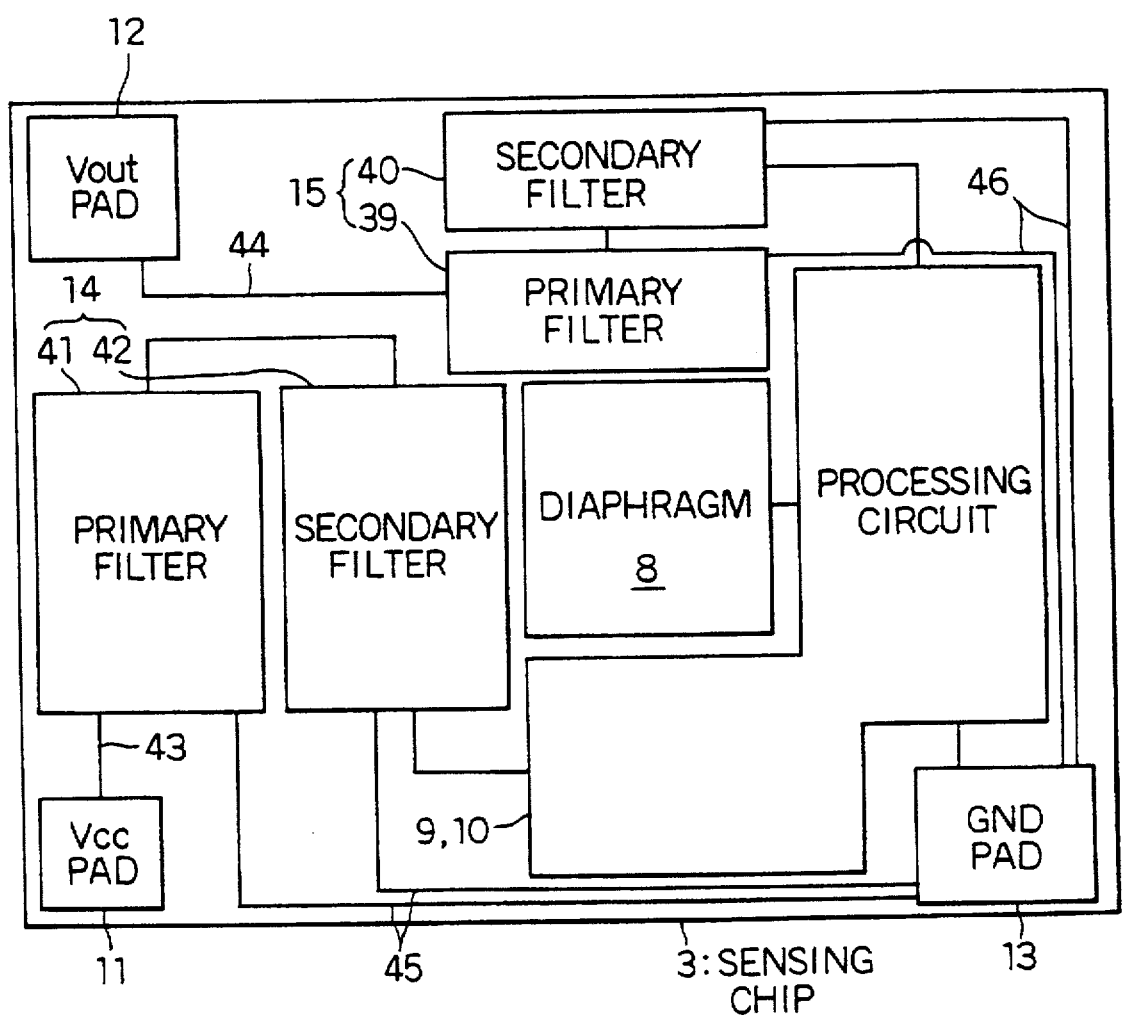
FIG. 17 is a plan view illustrating an example of other circuit layout of a sensor chip.

On the other hand, wiring or circuit layout should not be limited to that in FIG. 1 but may also be that in FIG. 17.

As described above, according to the present invention, an excellent effect can be obtained where wires related to on-chip filters for filtrating electromagnetic noise can be made preferable to other design options.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
    a semiconductor chip having:
        a circuit;
        a first pad for providing said circuit with a ground voltage;
        a second pad which is one of a pad for supplying electrical power to said circuit and a pad for outputting a signal from said circuit; and
        a filter circuit constructed of a resistor and a capacitor and interposed between said second pad and said circuit, for filtrating electromagnetic noise,
    wherein a plan layout of a wire route connecting said second pad and said filter circuit is set in such a manner that a resonance frequency in said wire route becomes higher than a frequency range of an electromagnetic wave which has an electric field strength giving influence to an operation of said circuit when said semiconductor device is used.

2. A semiconductor device according to claim 1, wherein said resonance frequency in said wire route is controlled to be 144 MHz or higher.

3. A semiconductor device according to claim 1, wherein said resonance frequency in said wire route is controlled to be 200 MHz or higher.

4. A semiconductor device according to claim 1, wherein said plan layout of said wire route connecting said second pad and said filter circuit is set in such a manner that a length of said wire route connecting said second pad and said filter circuit is shorter than a length of a wire route connecting said first pad and said filter circuit.

5. A semiconductor device according to claim 1, wherein said wire route connecting said second pad and said filter circuit is made to be an uncrossed wiring which is prohibited from crossing another wiring.

6. A semiconductor device according to claim 1, wherein said resistor constructing said filter circuit is a thin-film resistor disposed on said semiconductor chip with an insulating film interposed therebetween.

7. A semiconductor device according to claim 2, wherein said plan layout of said wire route connecting said second pad and said filter circuit is set in such a manner that a length of said wire route connecting said second pad and said filter circuit is shorter than a length of a wire route connecting said first pad and said filter circuit.

8. A semiconductor device according to claim 2, wherein said wire route connecting said second pad and said filter circuit is made to be an uncrossed wiring which is prohibited from crossing another wiring.

9. A semiconductor device according to claim 2, wherein said resistor constructing said filter circuit is a thin-film resistor disposed on said semiconductor chip with an insulating film interposed therebetween.

10. A semiconductor device according to claim 4, wherein said wire route connecting said second pad and said filter circuit is made to be an uncrossed wiring which is prohibited from crossing another wiring.

11. A semiconductor device according to claim 4, wherein said resistor constructing said filter circuit is a thin-film resistor disposed on said semiconductor chip with an insulating film interposed therebetween.

12. A semiconductor device according to claim 5, wherein said resistor constructing said filter circuit is a thin-film resistor disposed on said semiconductor chip with an insulating film interposed therebetween.

13. A semiconductor device according to claim 6, wherein said thin-film resistor comprises CrSi.

14. A semiconductor device according to claim 6, wherein a cross-sectional area of said thin-film resistor is selected such that said thin-film resistor is precluded from being fused by a current flowing therethrough due to said electromagnetic noise.

15. A semiconductor device according to claim 9, wherein said thin-film resistor comprises CrSi.

16. A semiconductor device according to claim 9, wherein a cross-sectional area of said thin-film resistor is selected such that said thin-film resistor is precluded from being fused by a current flowing therethrough due to said electromagnetic noise.

17. A semiconductor device according to claim 13, wherein a cross-sectional area of said thin-film resistor is selected such that said thin-film resistor is precluded from being fused by a current flowing therethrough due to said electromagnetic noise.

18. A semiconductor device according to claim 14, wherein said cross-sectional area of said thin-film resistor is determined in association with said electric field strength.

19. A semiconductor device according to claim 16, wherein said cross-sectional area of said thin-film resistor is determined in association with said electric field strength.

20. A semiconductor device according to claim 17, wherein said cross-sectional area of said thin-film resistor is determined in association with said electric field strength.

21. A semiconductor device comprising:
    a circuit formed on a semiconductor chip;
    a ground pad for providing a ground voltage;
    a power supply pad for supplying electrical power to said circuit;
    an output pad for transmitting an output signal of said circuit;
    a first filter disposed between said circuit and said power supply pad; and
    a second filter disposed between said circuit and said output pad,
    wherein a plan layout of a wire connecting said first filter and said power supply pad and a wire connecting said second filter and said output pad is set in such a manner that resonance frequencies in said wires become higher than a frequency range of an electromagnetic wave which has an electric field strength giving influence to an operation of said circuit.

22. A semiconductor device according to claim 21, wherein said plan layout of said wires is set in such a manner that a length of said wire connecting said first filter and said power supply pad is shorter than a length of a wire connecting said first filter and said ground pad, and a length of said wire connecting said second filter and said output pad is shorter than a length of a wire connecting said second filter and said ground pad.

23. A semiconductor device according to claim 21, wherein said plan layout of said wires is set in such a manner that said wire connecting said first filter and said power supply pad and said wire connecting said second filter and said output pad are each made to be an uncrossed wire which is prohibited from crossing another wire.

24. A semiconductor device according to claim 21, wherein said first and second filters each comprise a resistor and a capacitor.

25. A semiconductor device according to claim 21, wherein said first and second filters each comprise a first combination of a first resistor and a first capacitor and a second combination of a second resistor and a second capacitor, said first combination of the first resistor and the first capacitor and said second combination of the second resistor and the second capacitor being connected in series.

* * * * *